(12) United States Patent
Dong

(10) Patent No.: US 12,082,349 B2
(45) Date of Patent: Sep. 3, 2024

(54) ELECTRONIC DEVICE

(71) Applicant: Honor Device Co., Ltd., Shenzhen (CN)

(72) Inventor: Xiaoyong Dong, Shenzhen (CN)

(73) Assignee: HONOR DEVICE CO., LTD., Shenzhen (CN)

(*) Notice: Subject to any disclaimer, the term of this patent is extended or adjusted under 35 U.S.C. 154(b) by 0 days.

(21) Appl. No.: 17/800,289

(22) PCT Filed: Apr. 29, 2022

(86) PCT No.: PCT/CN2022/090391
§ 371 (c)(1),
(2) Date: Aug. 17, 2022

(87) PCT Pub. No.: WO2023/284373
PCT Pub. Date: Jan. 19, 2023

(65) Prior Publication Data
US 2024/0130048 A1    Apr. 18, 2024

(30) Foreign Application Priority Data
Jul. 16, 2021  (CN) .......................... 202110809106.6

(51) Int. Cl.
*H05K 1/02* (2006.01)
*H05K 1/05* (2006.01)
(Continued)

(52) U.S. Cl.
CPC ........... *H05K 3/301* (2013.01); *H05K 1/0219* (2013.01); *H05K 1/05* (2013.01); *H05K 1/11* (2013.01);
(Continued)

(58) Field of Classification Search
CPC ...... H05K 3/301; H05K 3/103; H05K 1/0219; H05K 1/05; H05K 1/11; H05K 2201/0355;
(Continued)

(56) References Cited

U.S. PATENT DOCUMENTS

| | | | | |
|---|---|---|---|---|
| 7,242,433 B2* | 7/2007 | Tanaka | ................... | H04N 23/54 257/E31.127 |
| 7,327,005 B2* | 2/2008 | Brechignac | ........... | H01L 23/552 257/E31.118 |

(Continued)

FOREIGN PATENT DOCUMENTS

| | | |
|---|---|---|
| CN | 1738324 A | 2/2006 |
| CN | 103795827 A | 5/2014 |

(Continued)

*Primary Examiner* — Hoa C Nguyen
(74) *Attorney, Agent, or Firm* — Conley Rose, P.C.

(57) ABSTRACT

An electronic device includes a circuit board and a camera assembly. The circuit board has a mounting hole extending through the circuit board in a thickness direction, and the mounting hole includes a first end and a second end oppositely arranged along the thickness direction of the circuit board. The camera assembly includes a first part arranged in the mounting hole and a second part extending out from the first end of the mounting hole, and the first part includes a camera substrate assembly. A support member is arranged on the circuit board and at the mounting hole and the first part is arranged on the support member. The support member includes at least one conductive sheet. The at least one conductive sheet is further coupled to a metal wiring of the circuit board, and the at least one conductive sheet is insulated from the camera substrate assembly.

20 Claims, 9 Drawing Sheets

(51) Int. Cl.
*H05K 1/11* (2006.01)
*H05K 3/10* (2006.01)
*H05K 3/30* (2006.01)

(52) U.S. Cl.
CPC ..... *H05K 3/103* (2013.01); *H05K 2201/0355* (2013.01); *H05K 2201/10121* (2013.01); *H05K 2201/10386* (2013.01)

(58) Field of Classification Search
CPC .......... H05K 2201/10121; H05K 2201/10386; G02B 6/4219; G02B 13/001; G02B 21/362
See application file for complete search history.

(56) References Cited

U.S. PATENT DOCUMENTS

| | | | |
|---|---|---|---|
| 7,387,255 B2 | 6/2008 | Kajiwara et al. | |
| 10,116,843 B2* | 10/2018 | Zhang | H04N 23/54 |
| 10,291,834 B2 | 5/2019 | Wei et al. | |
| 10,701,255 B2 | 6/2020 | Wang et al. | |
| 2004/0233650 A1* | 11/2004 | Miyashita | H04N 23/54 |
| | | | 361/761 |
| 2017/0353646 A1* | 12/2017 | Wang | H01L 27/14627 |
| 2017/0353662 A1* | 12/2017 | Enta | G02B 27/646 |
| 2018/0234595 A1* | 8/2018 | Lim | H04N 23/54 |
| 2018/0241917 A1* | 8/2018 | Zhang | H04N 23/52 |
| 2019/0361153 A1* | 11/2019 | Wang | G02B 7/021 |
| 2019/0387145 A1* | 12/2019 | Momiuchi | H05K 1/189 |
| 2022/0014654 A1* | 1/2022 | Park | H04N 23/54 |
| 2022/0304155 A1 | 9/2022 | Lei et al. | |
| 2023/0247272 A1* | 8/2023 | Han | H04N 23/90 |
| | | | 348/373 |

FOREIGN PATENT DOCUMENTS

| | | |
|---|---|---|
| CN | 104580856 A | 4/2015 |
| CN | 106454045 A | 2/2017 |
| CN | 107580168 A | 1/2018 |
| CN | 207939833 U | 10/2018 |
| CN | 210491015 U | 5/2020 |
| CN | 111405756 A | 7/2020 |
| CN | 111653196 A | 9/2020 |
| CN | 112399031 A | 2/2021 |
| EP | 3340586 A1 | 6/2018 |
| EP | 3386181 A1 | 10/2018 |
| JP | 2013106259 A | 5/2013 |

* cited by examiner

ELECTRONIC DEVICE

CROSS-REFERENCE TO RELATED APPLICATIONS

This application is a U.S. National Stage of International Application No. PCT/CN2022/090391 filed on Apr. 29, 2022, which claims priority to Chinese Patent Application No. 202110809106.6, filed with the China National Intellectual Property Administration on Jul. 16, 2021, both of which are incorporated herein by reference in their entireties.

TECHNICAL FIELD

This application relates to the field of electronic technologies, and in particular, to an electronic device.

BACKGROUND

With the popularity of consumer electronic products such as a smart phone, a tablet computer, and the like, "thinness" has become one of the main considerations in the current electronic product design. A thickness of the electronic product mainly depends on a thickness of a camera, especially a rear camera. In order to reduce a degree to which the rear camera protrudes, a hole is mainly dug on a main board (that is, a circuit board). In this case, wiring cannot be laid in a region of the main board on which the hole is dug. As the camera is arranged at the hole, the hole inevitably cuts off a charging path on the circuit board or a high-current path where a voltage of battery (Voltage of Battery, VBAT) supplies power to other devices, which increases impedances of these paths, reduces efficiency, increases power consumption, and the like.

SUMMARY

A main objective of this application is to provide an electronic device. A camera assembly may be supported, and a charging path or a high-current path may be shortened, so that an impedance can be reduced, efficiency can be improved, and power consumption can be prevented from being increased.

In order to achieve the foregoing objective, the present invention adopts the following technical solutions.

According to a first aspect, this application provides an electronic device, including: a circuit board and a camera assembly, where the circuit board has a mounting hole extending through the circuit board in a thickness direction, and the mounting hole includes a first end and a second end oppositely arranged along the thickness direction of the circuit board; the camera assembly includes a first part arranged in the mounting hole and a second part extending out from the first end of the mounting hole, and the first part includes a camera substrate assembly; and a support member, arranged on the circuit board and at the mounting hole, where the first part is arranged on the support member, the support member includes at least one conductive sheet, the at least one conductive sheet is further coupled to a metal wiring on the circuit board, and the at least one conductive sheet is insulated from the camera substrate assembly. By arranging the support member, the support member not only can support the camera assembly, but also can couple the conductive sheet to the metal wiring on the circuit board. For example, the support member connects the conductive sheet with a high-current power supply network (such as a high-current charging network formed by a VBUS line) on the circuit board, thereby shortening the charging path and reducing the impedance. In addition, since the conductive sheet is insulated from the camera substrate assembly, the conductive sheet may further be prevented from being coupled to the high-current network in the camera substrate assembly.

In an implementation of the first aspect, one conductive sheet is arranged. The support member further includes an insulating layer arranged on a surface of the conductive sheet close to the first part, where the insulating layer is configured to insulate the conductive sheet from the camera substrate assembly. The insulating layer may be arranged only on the surface of the conductive sheet close to the first part and at a position where the conductive sheet comes into contact with the camera substrate assembly, so that the conductive sheet is insulated from the camera substrate assembly.

In an implementation of the first aspect, a plurality of conductive sheets are arranged, the plurality of conductive sheets are insulated from each other, and each conductive sheet is coupled to one metal wiring on the circuit board. In this way, a plurality of high-current paths can be implemented, and an impedance of each high-current path can be reduced.

In an implementation of the first aspect, the plurality of conductive sheets are arranged at intervals on a plane parallel to a surface of the circuit board, and a gap is provided between every two adjacent conductive sheets. The support member further includes an insulating housing. The plurality of conductive sheets are arranged in the insulating housing and are insulated from the camera substrate assembly by the insulating housing. The plurality of conductive sheets are arranged at intervals on the plane parallel to the surface of the circuit board, and the gap is provided between every two adjacent conductive sheets, so that the plurality of conductive sheets are located on a same plane, and every two adjacent conductive sheets are insulated from each other. In addition, the plurality of conductive sheets may further be fixed together by the insulating housing, so as to realize the integration of the support member. In addition, through a reasonable arrangement of a structure of the insulating housing, not only can insulation of the plurality of conductive sheets from the entire device stack be ensured, but also surface flatness of the support member can be ensured, thereby ensuring that the camera assembly is supported on the support member as flat as possible.

In an implementation of the first aspect, the insulating housing and the plurality of conductive sheets are integrally formed. The insulating housing and the plurality of conductive sheets may be formed by using an in-mold injection molding process. An example of the insulating housing may be made of a plastic material, the plurality of conductive sheets are arranged in a mold, and a plastic layer is injected on outer sides of the plurality of conductive sheets, so as to obtain the foregoing integrated structure.

In an implementation of the first aspect, the electronic device further includes a first collection of electronic components and a second collection of electronic components arranged on the circuit board, and at least one set of electrical connection lines connected between the first collection of electronic components and the second collection of electronic components. Each set of electrical connection lines include at least one metal wiring. The first collection of electronic components and the second collection of electronic components are respectively arranged on two opposite sides of the mounting hole along a reference direction. Each conductive sheet includes at least two connecting portions arranged on two opposite sides of the mounting hole along the reference direction. In a case that one conductive sheet is arranged, the one conductive sheet is configured as a part of the set of electrical connection lines, and is coupled to the first collection of electronic components and the second collection of electronic components by the at least one metal wiring. In a case that a plurality of conductive sheets are arranged, each conductive sheet is configured as a part of the set of electrical connection lines, and is coupled to the first collection of electronic components and the second collection of electronic components by the at least one metal wiring. The first collection of electronic components may include a charging chip, and the second collection of electronic components may include a second connector connected to a charging FPC. In this case, an internal power supply may be connected to the circuit board by a power connector, the charging FPC may be connected to the circuit board by the second connector, and an other end of the charging FPC may be connected to a USB interface. In this way, one conductive sheet may be configured as a part of the charging network and connected to the high-current charging network formed by the VBUS line. Alternatively, the first collection of electronic components may include the power connector connected to the internal power supply, and the second collection of electronic components may include other electronic components that is required to be powered by the internal power supply. In this case, the internal power supply is connected to the circuit board by the power connector, and one conductive sheet may be configured as a part of the power supply network and connected to a network formed by an internal voltage of battery VBAT supplying power to other electronic components. Alternatively, the first collection of electronic components may include a charging chip and a power connector connected to the internal power supply, and the second collection of electronic components may include a second connector connected to the charging FPC and other electronic components that are required to be powered by a battery. In this case, the internal power supply is connected to the circuit board by the power connector, the charging FPC may be connected to the circuit board by the second connector, and an other end of the charging FPC may be connected to the USB interface. In this way, one conductive sheet may be configured as a part of the charging network and connected to the high-current charging network formed by the VBUS line, and another conductive sheet is configured as a part of the power supply network and connected to a network formed by an internal voltage of battery VBAT supplying power to other electronic components.

In an implementation of the first aspect, each connecting portion of each conductive sheet is a pin structure, and each pin structure is inserted into the circuit board and connected to the metal wiring inside the circuit board. The connecting portion of the pin structure is adopted, so as to enhance connection stability between the conductive sheet and the circuit board. Therefore, the connection stability of the support member and the circuit board is enhanced, the support member can be prevented from falling, and supporting stability of the support member is further improved.

In an implementation of the first aspect, the electronic device further includes a shielding structure arranged between the conductive sheet and the first part, where the shielding structure is insulated from the conductive sheet. A high-current signal flowing through the conductive sheet may be shielded to avoid causing interference to a current signal flowing through the camera substrate assembly of the camera assembly.

In an implementation of the first aspect, the circuit board includes a first ground terminal, and the camera substrate assembly includes a second ground terminal. The shielding structure is coupled to the first ground terminal and/or the second ground terminal.

In an implementation of the first aspect, the shielding structure is made of a copper foil or a conductive fabric.

The embodiments of this application provide the electronic device. By arranging the support member, the support member not only can support the camera assembly, but also can couple the conductive sheet to the metal wiring on the circuit board. For example, the support member connects the conductive sheet with a high-current power supply network (such as a high-current charging network formed by a VBUS line) on the circuit board, thereby shortening the charging path and reducing the impedance. In addition, since the conductive sheet is insulated from the camera substrate assembly, the conductive sheet may further be prevented from being coupled to the high-current network in the camera substrate assembly.

BRIEF DESCRIPTION OF DRAWINGS

In order to more clearly describe the embodiments of the present invention or the technical solutions in the prior art, the accompanying drawings used in the description of the embodiments or the prior art will be briefly introduced below. Obviously, the accompanying drawings in the following description are merely some embodiments of the present invention. For those of ordinary skill in the art, other accompanying drawings can be obtained based on these accompanying drawings without creative efforts.

DESCRIPTION OF EMBODIMENTS

Figure 1A:
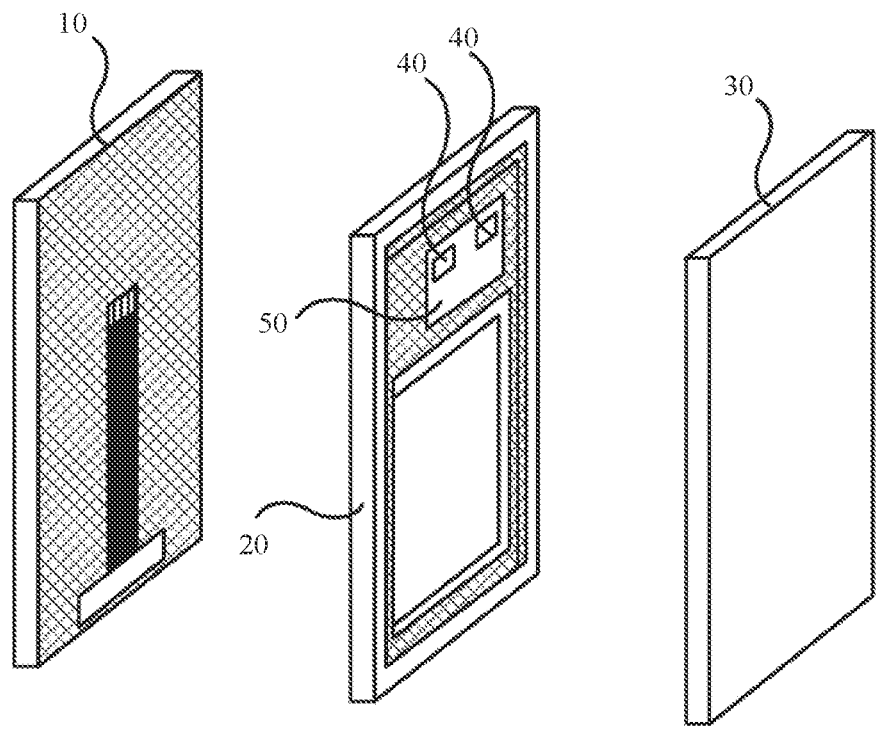
FIG. 1A is a structure diagram of an electronic device according to an embodiment of this application.

The technical solutions in some embodiments of this application are clearly and completely described below with reference to the accompanying drawings. Apparently, the described embodiments are merely some rather than all of the embodiments of this application. All other embodiments obtained by a person of ordinary skill in the art based on the embodiments of this application fall within the protection scope of this application.

Unless the context requires otherwise, throughout the specification and claims, the term "comprise" and other forms such as the third person singular "comprises" and the present participle form "comprising" are to be interpreted as open and inclusive, that is, "including, but not limited to". In the description of the specification, the term "one embodiment (one embodiment)", "some embodiments (some embodiments)", "exemplary embodiments (exemplary embodiments)". "example (example)", "specific example (specific example)", "some examples (some examples)", or the like are intended to indicate that specific features, structures, materials, or characteristics related to the embodiment or examples is included in at least one embodiment or example of this application. The schematic representations of the above terms do not necessarily represent the same embodiment or example. Furthermore, the specific features, structures, materials, or characteristics may be included in any one or more embodiments or examples in any suitable manner. The terms "first" and "second" are used for descriptive purposes only and should not be construed as indicating or implying relative importance or implicitly indicating the number of technical features indicated. Therefore, a feature defined by "first" or "second" can explicitly or implicitly includes one or more features. In the description of the embodiments of this application, unless otherwise stated, "a plurality of" means two or more.

In describing some embodiments, expressions "coupled" and "connected" and their derivatives may be used. For example, the term "connected" may be used in describing some embodiments to indicate that two or more components are in direct physical or electrical contact with each other. For another example, the term "coupled" may be used in describing some embodiments to indicate that two or more components are in direct physical or electrical contact. However, the terms "coupled" or "communicatively coupled (communicatively coupled)" may alternatively indicate that two or more components are not in direct contact with each other, but still cooperate or interact with each other. The embodiments disclosed herein are not necessarily limited by the content herein.

"At least one of A, B, and C" has the same meaning as "at least one of A, B, or C", which both include the following combinations of A. B, and C: A only, B only, C only, a combination of A and B, a combination of A and C, a combination of B and C, and a combination of A, B, and C.

"A and/or B" includes the following three combinations: A only, B only, and a combination of A and B.

Moreover, the use of "based on" means open and inclusive, since a process, a step, calculation or other actions "based on" one or more of the stated conditions or values may be based on an additional condition or exceed the stated values in practice.

As used herein, descriptions such as "about", "substantially", or "approximately" include the stated value as well as average values within an acceptable deviation range of the specified values. The acceptable deviation range is determined by the measurement in question and errors associated with a specific quantity of measurements (that is to say, limitations of a measurement system) that are considered by a person of ordinary skill in the art.

Exemplary implementations are described herein with reference to cross-sectional views and/or plan views as idealized exemplary accompanying drawings. In the accompanying drawings, thicknesses of a layer and a region are increased for clarity. Accordingly, variations on shapes relative to that in the accompanying drawings due to, for example, manufacturing technologies and/or tolerances, may be contemplated. Therefore, example implementations should not be construed as limited to the shapes of the regions shown herein, but include a shape deviation due to, for example, manufacturing. For example, an etched region shown as a rectangle generally has a curved feature. Therefore, the regions shown in the accompanying drawings are schematic in nature, and shapes of the regions are not intended to show an actual shape of a region of a device and are not intended to limit the scope of example implementations.

In the description of this application, it should be understood that orientation or position relationships indicated by the terms such as "center", "upper", "lower", "front", "rear", "left", "right", "vertical", "horizontal", "top", "bottom", "inside", and "outside" are based on orientation or position relationships shown in the accompanying drawings, and are used only for ease and brevity of illustration and description of this application, rather than indicating or implying that the mentioned apparatus or component must have a particular orientation or must be constructed and operated in a particular orientation. Therefore, such terms should not be construed as limiting of this application. In the description of this application, unless otherwise stated, "a plurality of" means two or more than two.

For example, an embodiment of this application provides an electronic device, including, but not limited to, a mobile phone, a tablet computer, a notebook computer, an ultra-mobile personal computer (ultra-mobile personal computer, UMPC), a handheld computer, an interphone, a netbook, a POS machine, a personal digital assistant (personal digital assistant, PDA), a driving recorder, a wearable device, a virtual reality device, or another mobile or fixed terminal with a circuit board.

In some embodiments of this application, a mobile phone is the above electronic device by way of example for description. As shown in FIG. 1A, the electronic device 01 mainly includes a display module 10, a middle frame 20, and a shell 30. The middle frame 20 is arranged between the display module 10 and the shell 30.

In some embodiments of this application, the display module 10 may include a liquid crystal display (liquid crystal display, LCD) and a back light unit (back light unit, BLU) configured to provide a light source to the liquid crystal display. Alternatively, in some other embodiments of this application, the display module 10 may include an organic light emitting diode (organic light emitting diode, OLED) display capable of realizing self-illumination. It should be understood that the display module 10 may include a display and a touch device. The display is configured to display content to a user, and the touch device is configured to receive a touch signal inputted by the user on the display.

In addition, in order to cause the electronic device 01 to realize more functions, the electronic device 01 further includes a plurality of electronic components 40.

Figure 1B:
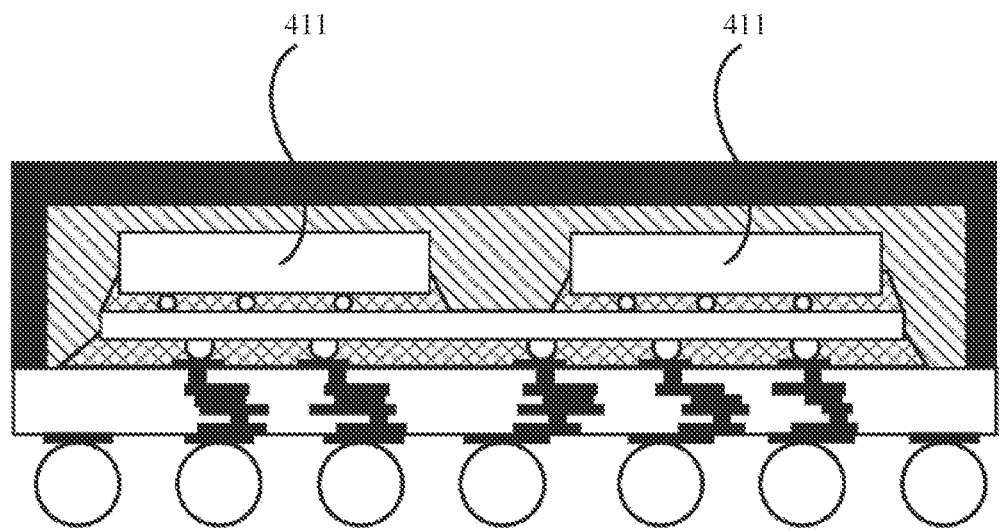
FIG. 1B is a structure diagram of an electronic component according to an embodiment of this application.

As shown in FIG. 1B, in some embodiments of this application, the electronic component 40 includes a packaging structure 410 and at least one chip 411 packaged in the packaging structure 410.

An embodiment of this application provides a circuit board assembly 50 arranged in the electronic device 01, as shown in FIG. 1A.

Figure 2A:
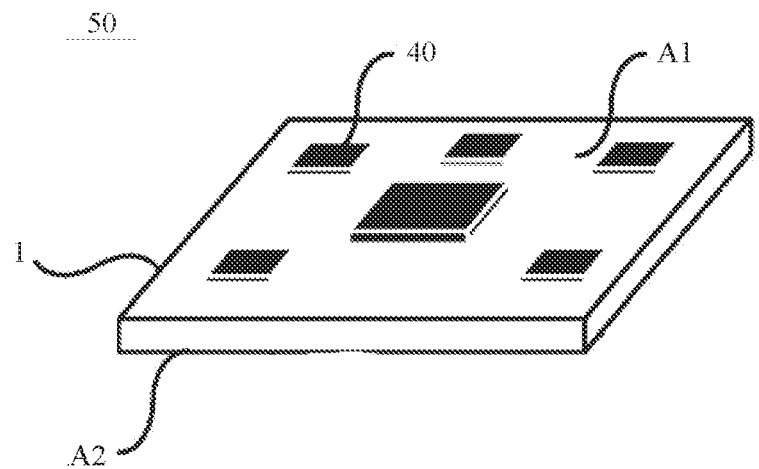
FIG. 2A is a three-dimensional view of a circuit board assembly according to an embodiment of this application.
Figure 2B:
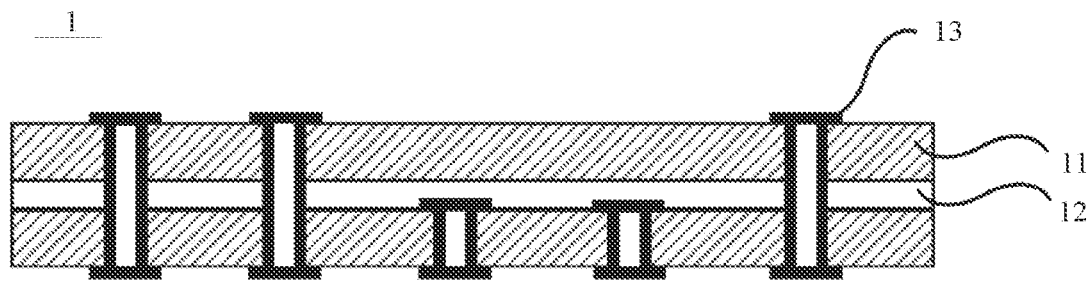
FIG. 2B is a side view of a circuit board according to an embodiment of this application.
Figure 2C:
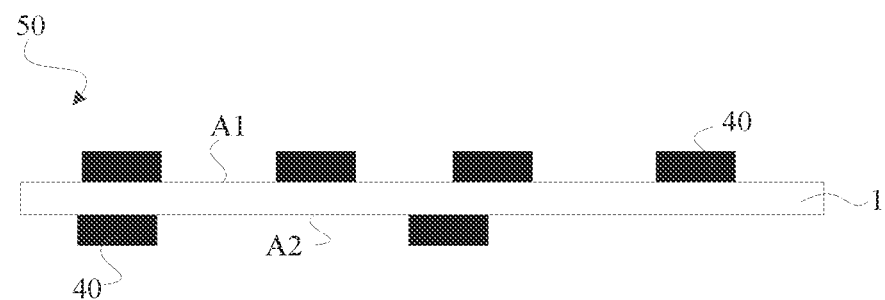
FIG. 2C is a side view of a circuit board assembly according to an embodiment of this application.

In some embodiments of this application, as shown in FIG. 1A, the circuit board assembly 50 may be arranged on a side surface of the middle frame 20 facing the shell 30. The circuit board assembly 50 includes a circuit board 1 shown in FIG. 2A. The circuit board 1 includes an upper surface A1 and a lower surface A2 that are arranged opposite to each other. The electronic component 40 may be integrated on the upper surface A1 or the lower surface A2 of the circuit board 1. Alternatively, as shown in FIG. 2C, the electronic component 40 is integrated on both the upper surface A1 and the lower surface A2 of a layer of the circuit board 1.

In some embodiments of this application, the circuit board 1 may be a printed circuit board (printed circuit board, PCB). As shown in FIG. 2B, it may be learned from a cross-sectional structure of the circuit board 1 that the circuit board 1 includes at least one insulating carrier plate 11. Two adjacent insulating carrier plates 11 are fixedly connected by a bonding layer 12.

In some embodiments of this application, a metal wiring 13 is arranged on the upper surface or the lower surface of the insulating carrier plate 11. Alternatively, in some other embodiments of this application, a metal wiring 13 is arranged on both the upper surface and the lower surface of the insulating carrier plate 11. The metal wiring 13 in the circuit board 1 is configured to electrically connect a plurality of electronic components 40 integrated on the circuit board 1.

In some embodiments of this application, the circuit board 1 is a main board, which is configured to carry the electronic components 40 and realize the electrical connection between the electronic components 40.

Figure 3:
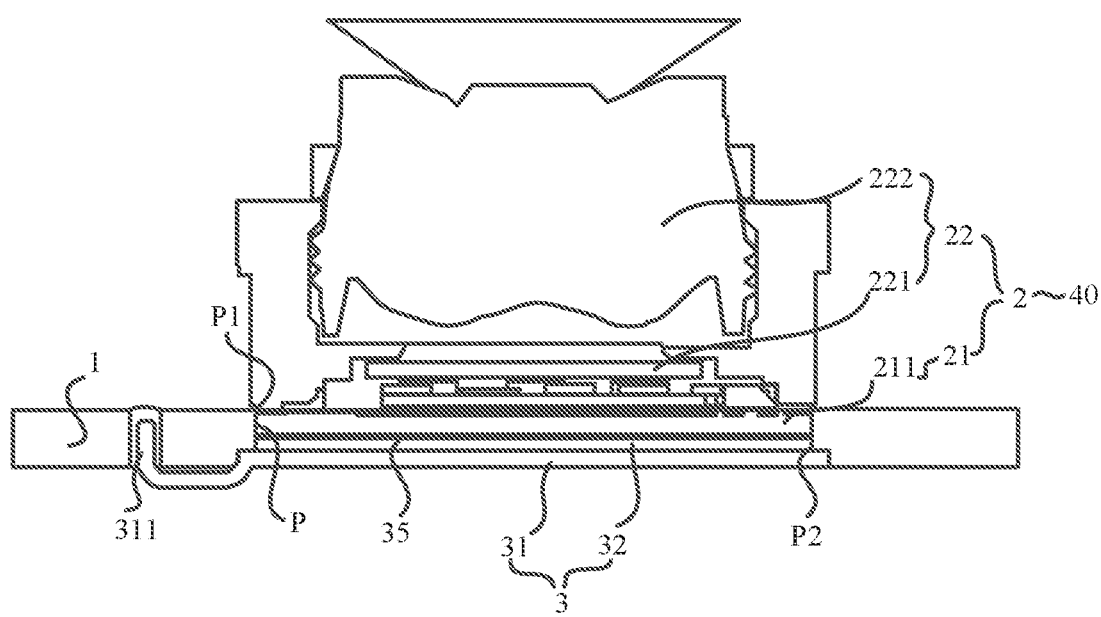
FIG. 3 is a side view of another circuit board assembly according to an embodiment of this application.

As shown in FIG. 3, in some embodiments of this application, each of the electronic components 40 may include a camera assembly 2, and an example of the camera assembly 2 may be a rear camera.

Figure 4:
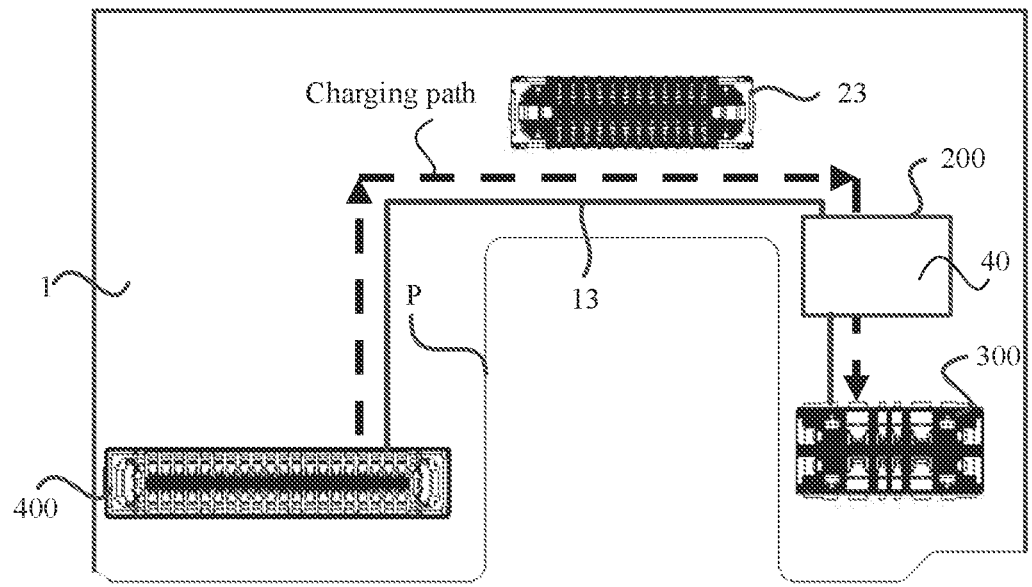
FIG. 4 is a top view of a circuit board assembly according to the related art.

In this application, in order to mount the camera assembly 2 and reduce a degree to which the camera assembly 2 protrudes from the circuit board, as shown in FIG. 3 and FIG. 4, the circuit board 1 has a mounting hole P extending through the circuit board 1 in a thickness direction. The mounting hole P includes a first end P1 and a second end P2 oppositely arranged along the thickness direction of the circuit board 1. The camera assembly 2 includes a first part 21 arranged in the mounting hole P and a second part 22 extending out from the first end P1 of the mounting hole P. The first part 21 includes a camera substrate assembly 211.

The second part 22 may include a photosensitive chip 221 and a lens assembly 222. The lens assembly 222 may include a lens and a filter.

The photosensitive chip 221 is arranged on the camera substrate assembly 211 and coupled to the camera substrate assembly 211. The filter and the lens are arranged in sequence along a direction away from the camera substrate assembly 211. The working principle of the camera assembly 2 is as follows. After the circuit board 1 powers on the camera assembly 2, the lens acquires an optical image and projects the optical image onto the photosensitive chip 221. Image information is converted to a data signal by the photosensitive chip 221, the data signal is sent to the circuit board 1 by a data port of the camera substrate assembly 211, the circuit board 1 transmits the data signal to the display module, and the display module displays the image information.

The photosensitive chip 221, the filter, and the lens may be all arranged in the mounting hole P or outside the mounting hole P, or a part of the photosensitive chip, the filter, and the lens is arranged in the mounting hole P, and another part of the photosensitive chip, the filter, and the lens is arranged outside the mounting hole P, which is not specifically limited herein. As shown in FIG. 3, FIG. 3 shows a situation in which the camera substrate assembly 211 is arranged in the mounting hole P, and the photosensitive chip 221, the filter, and the lens are all arranged outside the mounting hole P. Therefore, in a case that a height of the camera assembly 2 is fixed, the camera substrate assembly 211 is arranged in the mounting hole P, so as to greatly reduce a height by which the camera assembly 2 protruding from a surface of the circuit board 1, thereby reducing a thickness of the electronic device.

It should be noted that, in order to realize the signal transmission between the camera substrate assembly 211 and the circuit board 1, a part of the camera substrate assembly 211 is arranged in the mounting hole P, and an other part of the camera substrate assembly may extend to a side of the mounting hole P and is connected to a first connector 23 (as shown in FIG. 4). The first connector 23 is connected to the circuit board 1, so as to realize the electrical connection between the camera assembly 2 and the circuit board 1.

For example, the camera substrate assembly 211 is a rigid-flexible circuit board by way of example. The second end P2 of the mounting hole P is arranged close to the middle frame, and the camera substrate assembly 211 extends out from the first end P1 of the mounting hole P, extends to a position of the first connector 23 and is connected to the first connector 23. The first connector 23 may be a BTB (Board to Board, board to board) connector. In this case, the camera assembly 2 is connected to the circuit board 1 in a BTB (Board to Board, board to board) manner. The BTB connector is configured to connect two PCBs to achieve mechanical connection and electrical connection. The BTB manner is characterized in that male and female connectors are used in pairs. For example, a male connector is used to be attached to the circuit board 1 (or the camera substrate assembly 211), and the female connector is attached to the camera substrate assembly 211 (or the circuit board 1) to realize the connection.

Based on the above, in the related art, due to the existence of the mounting hole P, in the case where the camera assembly 2 is mainly supported by the middle frame or a bracket, the bracket may be fixed to the circuit board 1 by bonding or welding.

Figure 5:
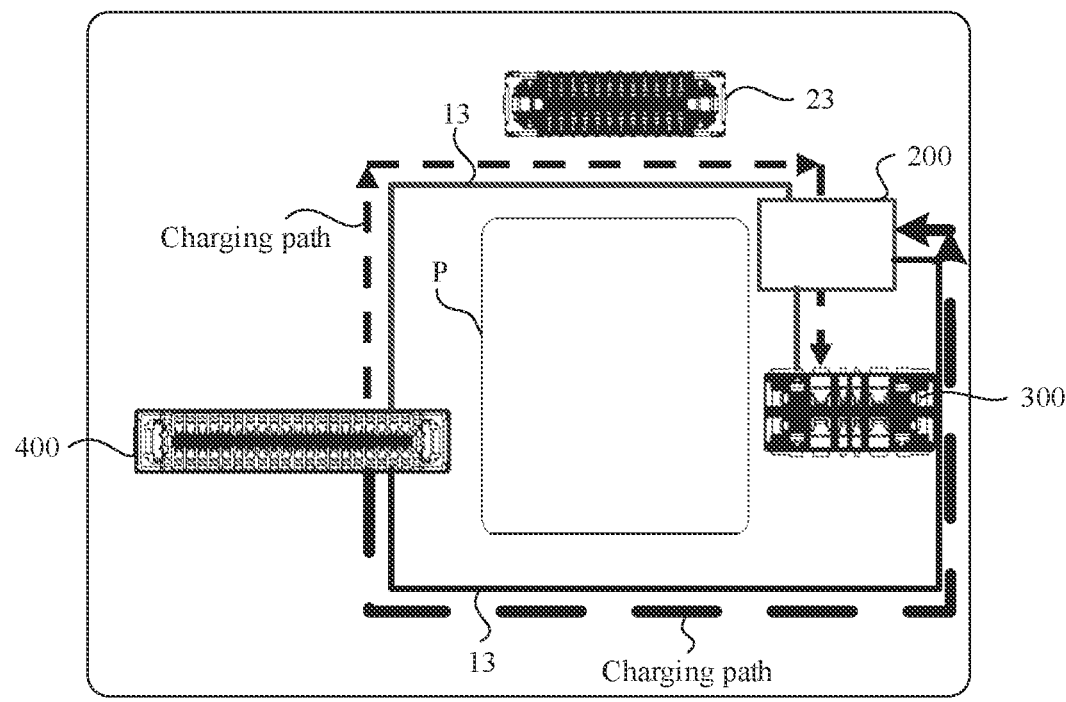
FIG. 5 is a top view of another circuit board assembly according to the related art.

Charging is used as an example. Due to the existence of the mounting hole P, as shown in FIG. 4 and FIG. 5, a metal wiring 13 configured to form a charging path on the circuit board 1 is required to be wound above the mounting hole P, which causes the charging path to become longer, increases the charging impedance, reduces the efficiency, and increases the power consumption.

Figure 6:
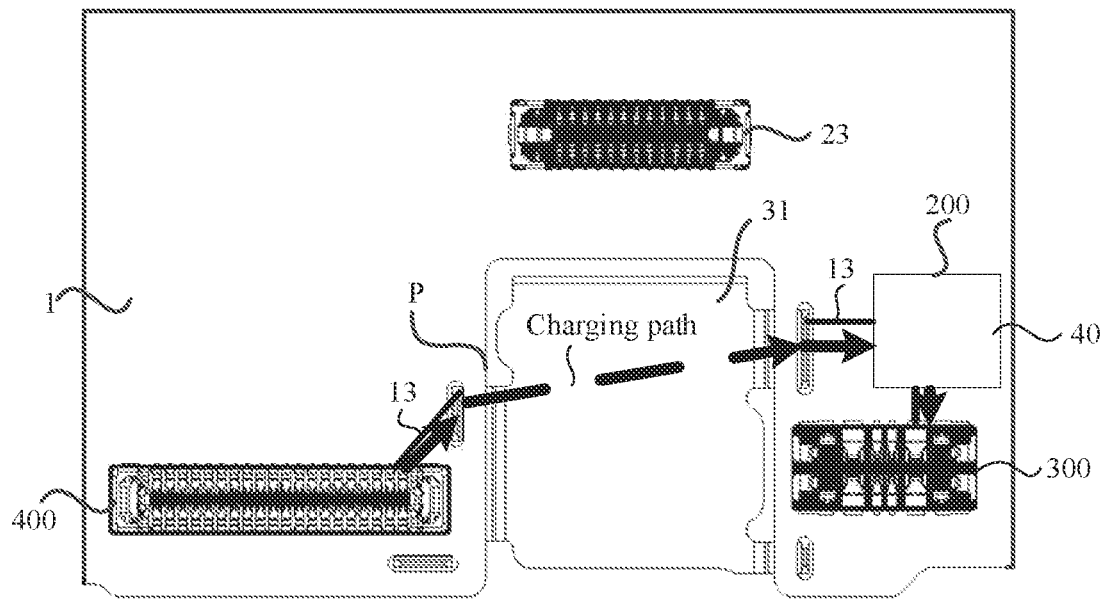
FIG. 6 is a top view of a circuit board assembly according to an embodiment of this application.

In some embodiments of this application, as shown in FIG. 3 and FIG. 6, the circuit board assembly further includes a support member 3 arranged on the circuit board 1 and at the mounting hole P. The first part 21 is arranged on the support member 3. The support member 3 includes at least one conductive sheet 31. The at least one conductive sheet 31 is further coupled to the metal wiring 13 on the circuit board 1, and the at least one conductive sheet 31 is insulated from the camera substrate assembly 211.

At least one conductive sheet 31 is arranged, which means that one or more conductive sheets 31 are arranged. In a case that one conductive sheet 31 is arranged, the conductive sheet 31 may be coupled to one or more metal wirings 13 on the circuit board 1. In a case that a plurality of conductive sheets 31 are arranged, each conductive sheet 31 may be coupled to one or more metal wirings 13 on the circuit board 1, or a plurality of conductive sheets 31 may be coupled to the same metal wiring 13 on the circuit board 1. In this case, the plurality of conductive sheets 31 may be connected in series or in parallel.

In a case that one metal wiring 13 is arranged, the metal wiring 13 may be connected between one signal port of one of two electronic components 40 and the other signal port of the other of the two electronic components (for one electronic component 40, the signal port may include one or more pins). In a case that a plurality of metal wirings 13 are arranged, the plurality of metal wirings 13 may be connected in parallel between one signal port of one of two electronic components 40 and the other signal port of the other of the two electronic components to transmit a same signal between the two electronic components 40. In a case that a plurality of metal wirings 13 are arranged, the plurality of metal wirings 13 may be respectively connected between a plurality of pairs of signal ports of the two electronic components 40 to transmit different signals between the two electronic components 40.

For example, the two electronic components 40 are respectively a charging chip 200 and a charging FPC (Flexible Printed Circuit board, flexible printed circuit) (as shown in FIG. 4, only a second connector 400 connected to the charging FPC is shown) by way of example. One or more metal wirings 13 connected between the charging chip 200 and the charging FPC may be arranged. As shown in FIG. 4, one metal wiring 13 is connected between the charging chip 200 and the charging FPC by way of example. Before the support member 3 is arranged, the metal wiring 13 is connected at one end to a pin of the charging chip 200 and at an other end to a pin of the charging FPC to transmit a high-current charging signal formed by a VBUS line (the VBUS line is a power line for a HOST/HUB to supply power to a USB device). As shown in FIG. 5, two metal wirings 13 are connected between the charging chip 200 and the charging FPC by way of example. Before the support member 3 is arranged, each of the two metal wirings 13 is connected to one pin of each of the charging chip 200 and the charging FPC. All pins of the charging chip 200 and the charging FPC that are configured to connect the two metal wirings 13 belong to a same signal port (for example, the second connector 400 has two pins configured to transmit a current, and the charging chip 200 has two corresponding pins configured to receive the current). The transmission of the same signal (such as the high-current charging signal formed by the VBUS line) is realized by the two metal wirings 13. It may be understood that the two metal wirings 13 may not belong to the same signal port.

Figure 7:
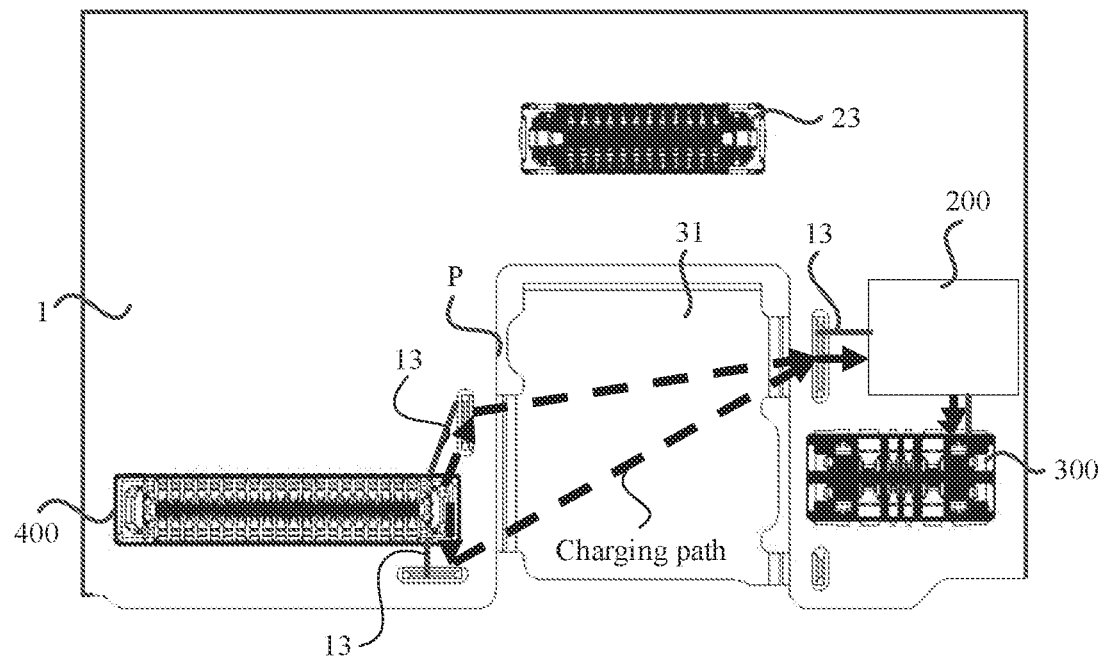
FIG. 7 is a top view of another circuit board assembly according to an embodiment of this application.
Figure 8:
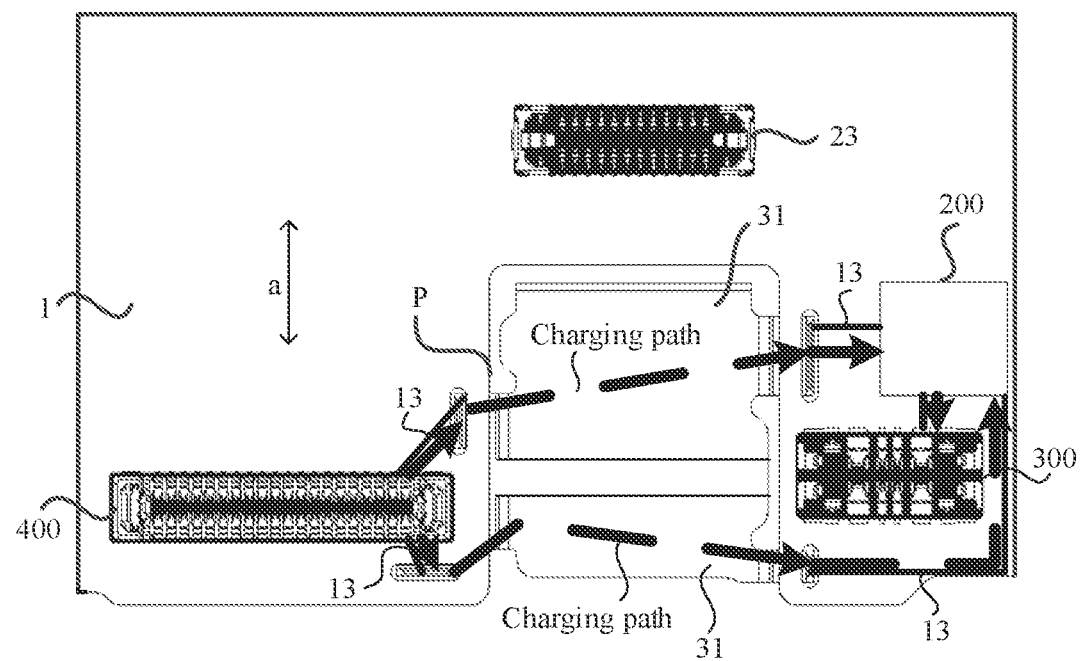
FIG. 8 is a top view of another circuit board assembly according to an embodiment of this application.

After the support member 3 is arranged, as shown in FIG. 4 and FIG. 6, an electrical connection line connected between the charging chip 200 and the charging FPC may include the metal wiring 13 arranged on the circuit board 1 and a part configured to connect the metal wiring 13 on the circuit board 1. In this case, before the support member 3 is arranged, one metal wiring 13 is connected between the charging chip 200 and the charging FPC by way of example. After the support member 3 is arranged, it may be regarded that a middle portion of the metal wiring 13 is disconnected. In this case, one conductive sheet 31 may be arranged, and the conductive sheet 31 is configured as a part configured to be connected to the metal wiring 13 on the circuit board 1, and is coupled to the metal wiring 13 arranged on the circuit board 1. As shown in FIG. 5 and FIG. 7, before the support member 3 is arranged, a plurality of metal wirings 13 are arranged between the charging chip 200 and the charging FPC by way of example. After the support member 3 is arranged, there are several possible situations. In a first situation, it may be regarded that middle portions of the plurality of metal wirings 13 are disconnected. In this case, as shown in FIG. 7, one conductive sheet is arranged, and the conductive sheet 31 as a whole is coupled to a part of each metal wiring 13 arranged on the circuit board 1. Alternatively, as shown in FIG. 8, a plurality of conductive sheets 31 are arranged, and each conductive sheet 31 is configured as a part of the disconnected metal wiring 13 and is coupled to the part of the metal wiring 13 arranged on the circuit board 1. In a second situation, a part of the plurality of metal wirings 13 is still arranged by wire winding, and the remaining part is disconnected. In this case, one conductive sheet 31 may be arranged, and the conductive sheet 31 as a w % bole is coupled to the part of the disconnected metal wiring 13 arranged on the circuit board 1. Alternatively, a plurality of conductive sheets 31 are arranged, and each conductive sheet 31 is configured as a part of the disconnected metal wiring 13 and is coupled to the part of the metal wiring 13 arranged on the circuit board 1.

Certainly, in a case that one metal wiring 13 connected between the charging chip 200 and the charging FPC is disconnected and a plurality of conductive sheets 31 are arranged, the plurality of conductive sheets 31 may also be connected in series or in parallel as a whole, and are configured as a part of the metal wiring 13 and are coupled to the part of the metal wiring 13 arranged on the circuit board 1.

In these embodiments, the support member 3 not only can support the camera assembly 2, but also can couple the conductive sheet 31 to the metal wiring 13 on the circuit board 1. For example, the support member connects the conductive sheet 31 to a high-current power supply network (such as a high-current charging network formed by a VBUS line) on the circuit board 1, thereby shortening the charging path and reducing the impedance. In addition, since the conductive sheet 31 is insulated from the camera substrate assembly 211, the conductive sheet 31 may further be prevented from being coupled to the high-current network in the camera substrate assembly 211.

It should be noted that, in addition to the high-current power supply network described above, the embodiment of this application may also be applicable to other high-current networks.

As shown in FIG. 3, when the first part 21 is arranged on the support member 3, the foregoing first part 21 may be fixed to the support member 3 by one bonding layer 35 to prevent the camera assembly 2 from being shifted. The bonding layer 35 may be made of a hot melt adhesive.

In some embodiments, as shown in FIG. 3, one conductive sheet 31 is arranged, and the support member 3 further includes an insulating layer 32 arranged on a surface of the conductive sheet 31 close to the first part 21. The insulating layer 32 is configured to insulate the conductive sheet 31 from the camera substrate assembly 211.

In these embodiments, the insulating layer 32 may be arranged only on the surface of the conductive sheet 31 close to the first part 21 and at a position where the conductive sheet comes into contact with the camera substrate assembly 211, so that the conductive sheet 31 is insulated from the camera substrate assembly 211. In this case, the first part 21 may be bonded and fixed to the insulating layer 32 by the bonding layer 35.

In some other embodiments, as shown in FIG. 8, a plurality of conductive sheets 31 are arranged, the plurality of conductive sheets 31 are insulated from each other, and each conductive sheet 31 is coupled to one metal wiring 13 on the circuit board 1.

In some embodiments, the plurality of conductive sheets 31 may be stacked on each other, and an insulating layer 32 is arranged between every two adjacent conductive sheets 31, so as to realize a plurality of high-current paths and reduce an impedance of each high-current path.

Figure 9:
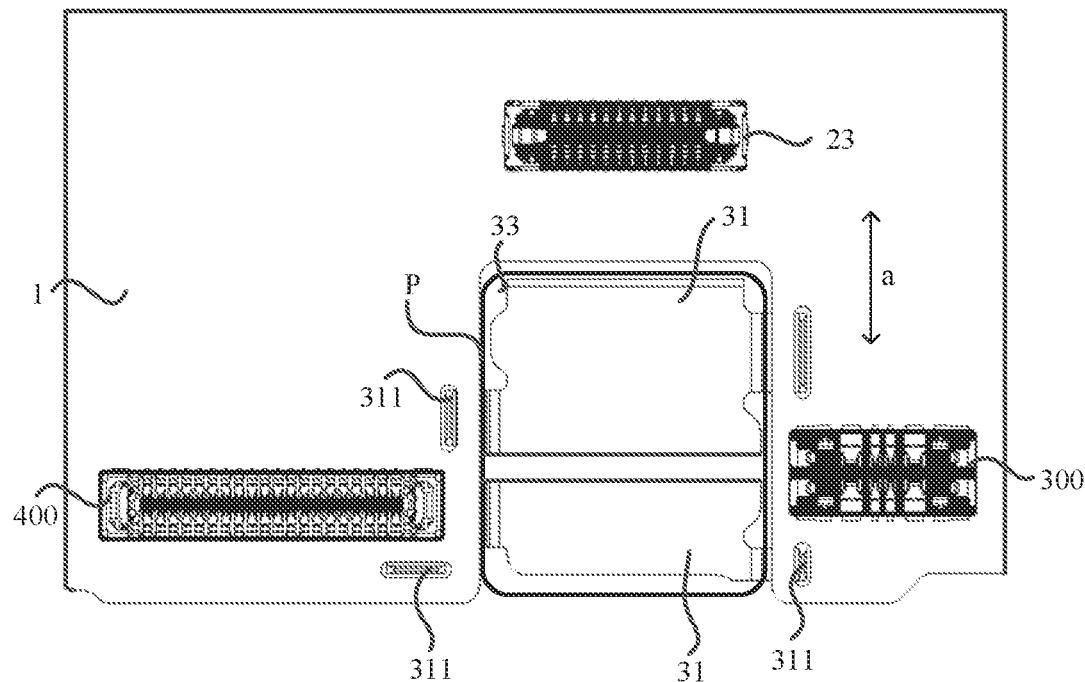
FIG. 9 is a top view of another circuit board assembly according to an embodiment of this application.

In some embodiments, as shown in FIG. 8, the plurality of conductive sheets 31 are arranged at intervals on a plane parallel to a surface of the circuit board 1 (in a direction indicated by an arrow a in FIG. 8), and a gap is provided between every two adjacent conductive sheets 31. As shown in FIG. 9, the support member 3 further includes an insulating housing 33. The plurality of conductive sheets 31 are arranged in the insulating housing 33, and the plurality of conductive sheets 31 are insulated from the camera substrate assembly 211 by the insulating housing 33.

In these embodiments, the plurality of conductive sheets 31 are arranged at intervals on the plane parallel to the surface of the circuit board 1, and the gap is provided between every two adjacent conductive sheets 31, so that the plurality of conductive sheets 31 are located on a same plane, and every two adjacent conductive sheets 31 are insulated from each other. In addition, the plurality of conductive sheets 31 may further be fixed together by the insulating housing 33, so as to realize the integration of the support member 3. In addition, through a reasonable arrangement of a structure of the insulating housing 33, not only can insulation of the plurality of conductive sheets 31 from the entire device stack be ensured, but also surface flatness of the support member 3 can be ensured, thereby ensuring that the camera assembly 2 is supported on the support member 3 as flat as possible. In this case, the first part 21 may be bonded and fixed to the insulating housing 33 by the bonding layer 35.

In some embodiments, as shown in FIG. 9, the insulating housing 33 and the plurality of conductive sheets 31 are integrally formed. In these embodiments, the insulating housing 33 and the plurality of conductive sheets 31 may be formed by using an in-mold injection molding process. An example of the insulating housing 33 may be made of a plastic material, the plurality of conductive sheets 31 are arranged in a mold, and a plastic layer is injected on outer sides of the plurality of conductive sheets 31, so as to obtain the foregoing integrated structure.

In some embodiments, as shown in FIG. 10 to FIG. 13, the circuit board assembly 50 further includes a first collection of electronic components 401 and a second collection of electronic components 402 arranged on the circuit board 1, and at least one set of electrical connection lines 100 connected between the first collection of electronic components 401 and the second collection of electronic components 402. Each set of electrical connection lines 100 include at least one metal wiring 13. The first collection of electronic components 401 and the second collection of electronic components 402 are respectively arranged on two opposite sides of the mounting hole P along a reference direction (a direction shown by an arrow b in FIG. 10). Each conductive sheet 31 includes at least two connecting portions 311 arranged on two opposite sides of the mounting hole P along the reference direction. In a case that one conductive sheet 31 is arranged, the one conductive sheet 31 is configured as a part of the set of electrical connection lines 100 and is coupled to the first collection of electronic components 401 and the second collection of electronic components 402 by the at least two connecting portions 311 and the at least one metal wiring 13. In a case that a plurality of conductive sheets 31 are arranged, each conductive sheet 31 is configured as a part of the set of electrical connection lines 100 and is coupled to the first collection of electronic components 401 and the second collection of electronic components 402 by the at least two connecting portions 311 and the at least one metal wiring 13.

Figure 10:
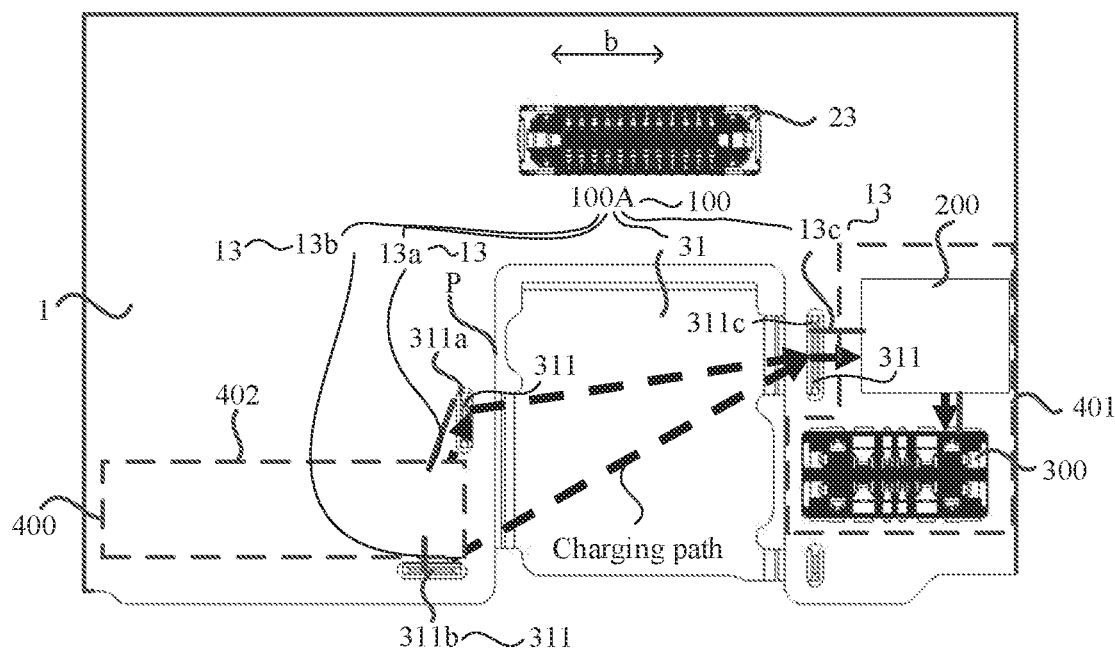
FIG. 10 is a structure diagram of an electrical connection line between a first collection of electronic components and a second collection of electronic components according to an embodiment of this application.
Figure 11:
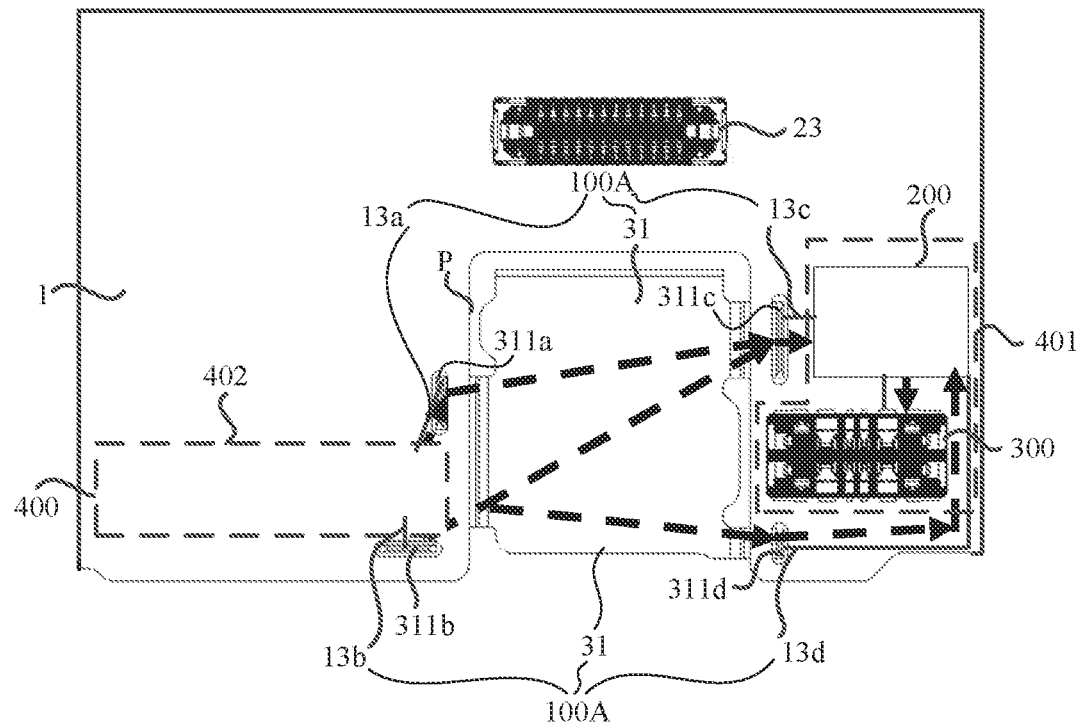
FIG. 11 is a structure diagram of another electrical connection line between a first collection of electronic components and a second collection of electronic components according to an embodiment of this application.
Figure 12:
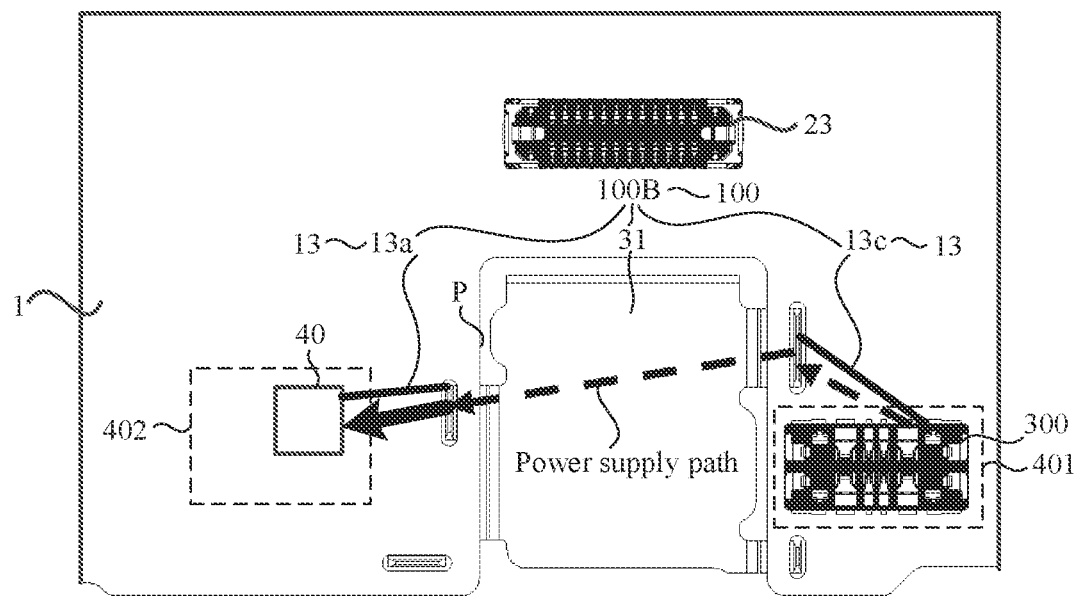
FIG. 12 is a structure diagram of another electrical connection line between a first collection of electronic components and a second collection of electronic components according to an embodiment of this application.
Figure 13:
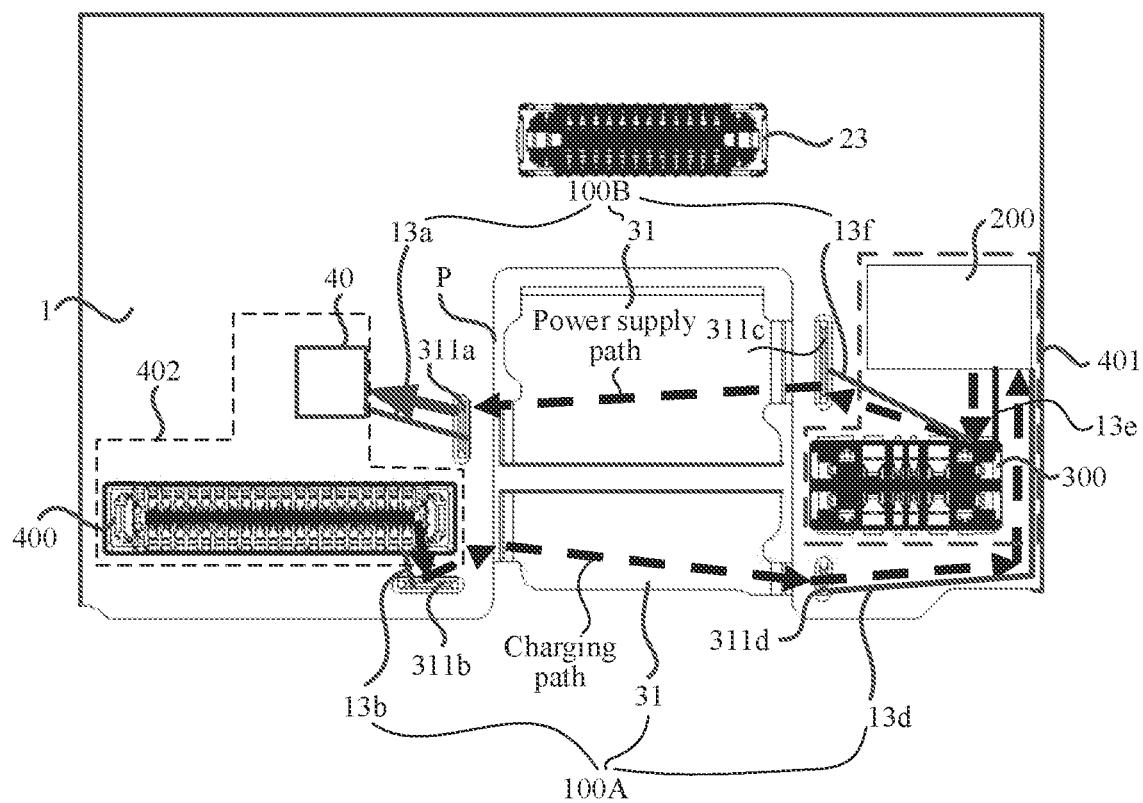
FIG. 13 is a structure diagram of another electrical connection line between a first collection of electronic components and a second collection of electronic components according to an embodiment of this application.

In these embodiments, for example, as shown in FIG. 10 and FIG. 11, the first collection of electronic components 401 may include a charging chip 200, and the second collection of electronic components 402 may include a second connector 400 connected to a charging FPC. In this case, an internal power supply may be connected to the circuit board 1 by a power connector 300, the charging FPC may be connected to the circuit board 1 by the second connector 400, and an other end of the charging FPC may be connected to a USB interface. In this way, one conductive sheet 31 may be configured as a part of the charging network and connected to the high-current charging network formed by the VBUS line. Alternatively, as shown in FIG. 12, the first collection of electronic components 401 may include the power connector 30) connected to the internal power supply, and the second collection of electronic components 402 may include other electronic components 40 that is required to be powered by the internal power supply, for example, power consuming devices such as a CPU, a radio frequency module, and the like. In this case, the internal power supply is connected to the circuit board 1 by the power connector 300, and one conductive sheet 31 may be configured as a part of the power supply network and connected to a network formed by an internal voltage of battery VBAT supplying power to other electronic components 40. Alternatively, as shown in FIG. 13, the first collection of electronic components 401 may include a charging chip 200 and a power connector 300 connected to the internal power supply, and the second collection of electronic components 402 may include a second connector 400 connected to the charging FPC and other electronic components 40 that are required to be powered by a battery. In this case, the internal power supply is connected to the circuit board 1 by the power connector 300, the charging FPC may be connected to the circuit board 1 by the second connector 400, and an other end of the charging FPC may be connected to the USB interface. In this way, one conductive sheet 31 may be configured as a part of the charging network and connected to the high-current charging network formed by the VBUS line, and another conductive sheet 31 is configured as a part of the power supply network and connected to a network formed by an internal voltage of battery VBAT supplying power to other electronic components 40.

In these embodiments, compared with the wire winding above the mounting hole P in the related art, on the one hand, the charging and/or power supply path may be shortened, and on the other hand, the metal wiring 13 arranged on the circuit board 1 is replaced with the conductive sheet 31. In this way, a thickness and a width of the conductive sheet 31 may be increased by using a position of the mounting hole P, the circuit impedance is minimized, the efficiency is enhanced, and the power consumption is prevented from being increased. For example, the foregoing corresponding power supply network impedance may be reduced by more than 60%.

Figure 14:
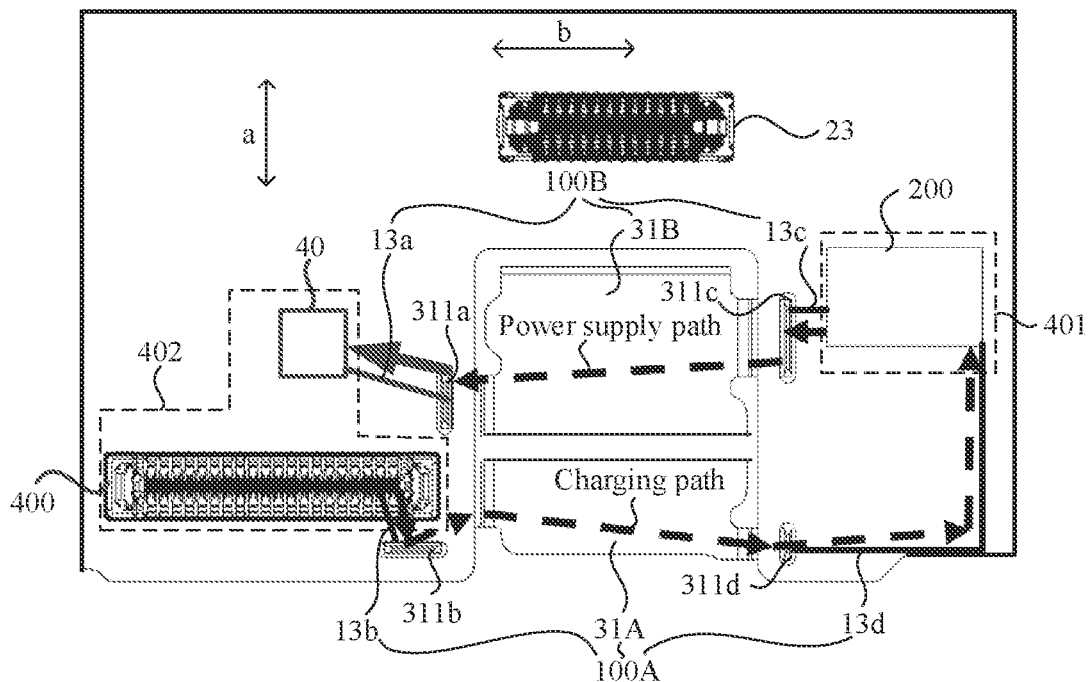
FIG. 14 is a structure diagram of still another electrical connection line between a first collection of electronic components and a second collection of electronic components according to an embodiment of this application.

It should be noted that, in a case that one conductive sheet 31 is arranged, the conductive sheet 31 may be arranged at the mounting hole P, and is connected to the circuit board 1 by at least two connecting portions 311 arranged on two opposite sides of the mounting hole P along the reference direction. Herein, as shown in FIG. 10, FIG. 10 shows that one conductive sheet 31 is connected to three connecting portions 311 (that is, 311a, 311b, and 311c) of the conductive sheet 31 by the metal wiring 13 (that is, 13a, 13b, and 13c) arranged on the circuit board 1. The conductive sheet 31 is configured as a part of a first set of electrical connection lines 100A, to realize charging of the VBUS line. Specifically, a power pin of the second connector 400 is connected to a pin 311a by the metal wiring 13a on the circuit board 1, is connected to a pin 311b via the metal wiring 13b on the circuit board 1, and is connected to the charging chip 200 via a pin 311c of the conductive sheet 31 and the metal wiring 13c on the circuit board. Therefore, the first set of electrical connection lines 100A are formed. A combination of 13a and 13c may be regarded as one metal wiring, and a combination of 13b and 13c may be regarded as another metal wiring. The conductive sheet 31 is configured as a part of the first set of electrical connection lines 100A and is coupled to the first collection of electronic components 401 and the second collection of electronic components 402 by the three connecting portions and two metal wirings. As shown in FIG. 11, FIG. 11 shows that one conductive sheet 31 is connected to four connecting portions 311 (that is, 311a, 311b, 311c, and 311d) of the conductive sheet 31 by the metal wiring 13 (that is, 13a, 13b, 13c, and 13d) arranged on the circuit board 1, and the conductive sheet 31 is configured as a part of a first set of electrical connection lines 100A, to realize charging of the VBUS line. Specifically, a power pin of the second connector 400 is connected to the pin 311a by the metal wiring 13a on the circuit board 1, is connected to the pin 311b by the metal wiring 13b on the circuit board 1, and is connected to the charging chip 200 via the pin 311c of the conductive sheet 31 and the metal wiring 13c on the circuit board 1 and via the pin 311d of the conductive sheet 31 and the metal wiring 13d on the circuit board 1. Therefore, the first set of electrical connection lines 100A are formed. 13a and 13c may be regarded as one metal wiring, 13b and 13c may be regarded as another metal wiring, and 13b and 13d may be regarded as still another metal wiring. One conductive sheet 31 is configured as a part of the first set of electrical connection lines 100A, and is coupled to the first collection of electronic components 401 and the second collection of electronic components 402 by four connecting portions and three metal wirings. In a case that a plurality of conductive sheets 31 are arranged, the plurality of conductive sheets 31 are all arranged at the mounting hole P, and each of the plurality of conductive sheets 31 includes at least two connecting portions 311 arranged on two opposite sides of the mounting hole P along the reference direction. Each conductive sheet 31 is connected to the circuit board 1 by the respective at least two connecting portions 311. In this case, as shown in FIG. 14, the plurality of conductive sheets 31 may be arranged in a direction perpendicular to the reference direction. Herein, as shown in FIG. 14, FIG. 14 shows that one conductive sheet 31 (such as a first conductive sheet 31A) is connected to two connecting portions (such as 311b and 311d) of the first conductive sheet 31A by the metal wiring 13 (that is, 13b and 13d) arranged on the circuit board 1. The first conductive sheet 31A is configured as a part of the first set of electrical connection lines 100A to realize charging of the VBUS line charging. Another conductive sheet 31 (such as a second conductive sheet 31B) is connected to two connecting portions (such as 311a and 311c) of the second conductive sheet 31B by the metal wiring 13 (that is, 13a and 13c) arranged on the circuit board 1. The second conductive sheet 31B is configured as a part of a second set of electrical connection lines 100B, so as to realize a situation in which a current for direct charging passes through the charging chip 200 and supplies power to other electronic components 40. Specifically, the power pin of the second connector 400 is connected to the pin 311b by the metal wiring 13b on the circuit board 1, and is connected to the charging chip 200 via the pin 311d and the metal wiring 13d on the circuit board 1. Therefore, an electrical connection line for realizing the charging of the VBUS line is formed, that is, the first set of electrical connection lines 100A. A combination of 13b and 13d may be regarded as one metal wiring, and the first conductive sheet 31A is configured as a part of the first set of electrical connection lines 100A and is coupled to the first collection of electronic components 401 and the second collection of electronic components 402 by two connecting portions and one metal wiring. A power supply pin of the charging chip 200 is connected to the pin 311c by the metal wiring 13c on the circuit board 1, and is connected to other electronic components 40 via the pin 311a and the metal wiring 13a on the circuit board 1. Therefore, one electrical connection line for realizing a current for direct charging to supply power to other electronic components 40 via the charging chip 200 is formed, that is, the second set of electrical connection lines 100B. The combination of 13a and 13c may be regarded as one metal wiring, and the second conductive sheet 31B is configured as a part of the second set of electrical connection lines 100B and is coupled to the first collection of electronic components 401 and the second collection of electronic components 402 by two connecting portions and one metal wiring. This is a situation in which an electrical appliance (that is, the electronic component 40) is directly powered by the charging current, and during the period, the charging current does not flow through the internal power supply. Certainly, in some embodiments, as shown in FIG. 13, the first collection of electronic components 401 may further include a power connector 300 connected to an internal power supply. In this case, the internal power supply may be connected to the power connector 300, and the first set of electrical connection lines 100A may further include a metal wiring 13e connected between the charging chip 200 and the power connector 300, to complete charging of the internal power supply. The second set of electrical connection lines 100B may include a metal wiring 13f connected between the power connector 300 and the pin 311c, so as to supply power to other electronic components 40 by the internal power supply (or the current for direct charging). In a case that power is supplied to other electronic components 40 by the current for direct charging, the internal power supply is disconnected.

In the foregoing embodiment, one set of electrical connection lines 100 form a pathway between at least one pin of one of two electronic components 40 and at least one pin of the other of the two electronic components. As shown in FIG. 10, the first set of electrical connection lines 100A form a pathway between two pins of the second connector 400 and one pin of the charging chip 200. As shown in FIG. 11, the first set of electrical connection lines 100A form a pathway between two pins of the second connector 400 and two pins of the charging chip 200. As shown in FIG. 12, the second set of electrical connection lines 100B form a pathway between one pin of the electronic component 40 and one pin of the power connector 300. As shown in FIG. 13, the first set of electrical connection lines 100A form a pathway between one pin of the second connector 400 and one pin of the charging chip 200, and the second set of electrical connection lines 100B form a pathway between one pin of the electronic component 40 and one pin of the connector 300. As shown in FIG. 14, the first set of electrical connection lines 100A form a pathway between one pin of the electrical connector 400 and one pin of the charging chip 200, and the second set of electrical connection lines 100B form a pathway between one pin of the electronic component 40 and one pin of the charging chip 200.

The foregoing charging chip 200 is configured to convert a charging voltage of the VBUS line to a voltage (such as 5V, or the like) suitable for charging of the internal power supply. In addition, the foregoing first collection of electronic components 401 may further include a power management chip arranged on the circuit board 1. The power management chip is coupled to the internal power supply and other electronic components 40, and is configured to perform voltage distribution for supplying power to other electronic components 40 by the internal power supply.

It should be further noted that the at least two connecting portions 311 of each conductive sheet 31 may be connected to the circuit board 1 by surface mounting, or may be connected to the circuit board 1 by pinning, which is not specifically limited herein.

In a case that at least two connecting portions 311 of each conductive sheet 31 are connected to the circuit board 1 by the surface mounting, each connecting portion 311 and the metal wiring 13 formed on a surface of the circuit board 1 are soldered together. In a case that at least two connecting portions 311 of each conductive sheet 31 are connected to the circuit board 1 by pinning, each connecting portion 311 and the metal wiring formed inside the circuit board 1 are soldered together.

In some embodiments, as shown in FIG. 10 to FIG. 14, each connecting portion 311 of each conductive sheet 31 is a pin structure, and each pin structure is inserted into the circuit board 1 and connected to the metal wiring inside the circuit board 1 and may be connected to the metal wiring by soldering. In these embodiments, the connecting portion 311 of the pin structure can enhance the connection stability between the conductive sheet 31 and the circuit board 1, thereby enhancing the connection stability of the support member 3 and the circuit board 1, preventing the support member 3 from falling, and further enhancing the support stability of the support member 3.

A material of the conductive sheet 31 is not specifically limited, as long as the conductive sheet 31 can play the role of supporting and current transmission.

In some embodiments, the conductive sheet 31 is a steel sheet. Rigidity of the support member 3 may be ensured, the support member 3 may be prevented from being deformed, and the support stability can be enhanced. In addition, in a case that the steel sheet has a relatively large thickness and width, the steel sheet can reduce the impedance when being used for high current transmission.

Figure 15:
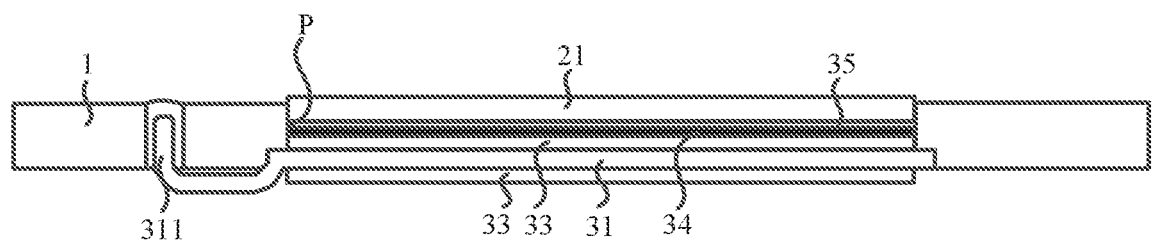
FIG. 15 is a side view of still another circuit board assembly according to an embodiment of this application.

In some embodiments, as shown in FIG. 15, the circuit board assembly 50 further includes a shielding structure 34 arranged between the conductive sheet 31 and the first part 21. The shielding structure 34 is insulated from the conductive sheet 31. A high-current signal flowing through the conductive sheet 31 may be shielded to avoid causing interference to the current signal flowing through the camera substrate assembly 211 of the camera assembly 2.

It should be noted that, in order to play the role of shielding, the shielding structure 34 may be arranged between the support member 3 and the first part 21. In this case, since the support member 3 is insulated from the first part 21, the shielding structure 34 may be arranged on the first part 21 or the support member 3 and is insulated from the conductive sheet 31. For example, in a case that the support member 3 further includes the insulating layer 32, the shielding structure 34 may be arranged on a side of the insulating layer 32 away from the conductive sheet 31, and is insulated from the conductive sheet 31 by the insulating layer 32. In a case that the support member 3 further includes the insulating housing 33, the shielding structure 34 may be arranged on a side of the insulating housing 33 away from the conductive sheet 31, and is insulated from the conductive sheet 31 by the insulating housing 33.

Certainly, in a case that the insulating housing 33 and the conductive sheet 31 are not integrally formed, the shielding structure 34 may also be arranged on a side of the insulating housing 33 close to the conductive sheet 31, and is insulated from the conductive sheet 31.

In some embodiments, the circuit board 1 includes a first ground terminal, and the camera substrate assembly 211 includes a second ground terminal. The shielding structure 34 is coupled to the first ground terminal and/or the second ground terminal.

In these embodiments, the shielding may be realized by coupling the shielding structure 34 to the first ground terminal and/or the second ground terminal.

In some embodiments, the shielding structure 34 may be made of a copper foil or a conductive fabric.

In these embodiments, the shielding structure 34 may be arranged on a surface of the first part 21 close to the support member 2 and connected to the first part 21 by a conductive adhesive (that is, the foregoing hot melt adhesive), so that the shielding structure 34 is electrically connected to the camera substrate assembly 211.

The second ground terminal of the camera substrate assembly 211 may be arranged on a reinforcing steel sheet of the foregoing first connector 23, and the second ground terminal of the camera substrate assembly 211 may be coupled to the first connector 23 and the first ground terminal by the reinforcing steel sheet, so that the shielding structure 34 is coupled to the first ground terminal and the second ground terminal.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An electronic device, comprising:
a circuit board with a mounting hole extending through the circuit board in a thickness direction, wherein the mounting hole comprises a first end and a second end oppositely arranged along the thickness direction of the circuit board;
a camera assembly comprising a first part arranged in the mounting hole and a second part extending out from the first end of the mounting hole, wherein the first part comprises a camera substrate assembly; and
a support member arranged on the circuit board and at the mounting hole, wherein the support member comprises at least one conductive sheet coupled to a metal wiring of the circuit board, wherein the at least one conductive sheet is insulated from the camera substrate assembly, wherein the first part is arranged on the support member.

2. The electronic device of claim 1, wherein one conductive sheet is coupled to a metal wiring of the circuit board, wherein the support member further comprises an insulating layer arranged on a surface of the conductive sheet close to the first part, and wherein the insulating layer insulates the conductive sheet from the camera substrate assembly.

3. The electronic device of claim 1, wherein a plurality of conductive sheets is coupled to a metal wiring of the circuit board, wherein the plurality of conductive sheets are insulated from each other, and wherein each conductive sheet is coupled to one metal wiring of the circuit board.

4. The electronic device of claim 3, wherein the plurality of conductive sheets are arranged at intervals on a plane parallel to a surface of the circuit board, wherein a gap is provided between every two adjacent conductive sheets, wherein the support member further comprises an insulating housing, and wherein the plurality of conductive sheets are arranged in the insulating housing and are insulated from the camera substrate assembly by the insulating housing.

5. The electronic device of claim 4, wherein the insulating housing and the plurality of conductive sheets are integrally formed.

6. The electronic device of claim 3, wherein the plurality of conductive sheets are stacked on each other, and an insulating layer is arranged between every two adjacent conductive sheets.

7. The electronic device of claim 1, further comprising:
a first collection of electronic components arranged on the circuit board;
a second collection of electronic components arranged on the circuit board; and
at least one set of electrical connection lines connected between the first collection of electronic components and the second collection of electronic components, wherein each set of electrical connection lines comprise at least one metal wiring.

8. The electronic device of claim 7, wherein the first collection of electronic components is arranged on an opposite side of the mounting hole along a reference direction from the second collection of electronic components.

9. The electronic device of claim 7, wherein one of the one or more conductive sheets forms a part of the set of electrical connection lines, and is coupled to the first collection of electronic components and the second collection of electronic components by the at least one metal wiring.

10. The electronic device of claim 7, wherein the first collection of electronic components comprises a charging chip, and wherein the second collection of electronic components comprises a connector connected to a Universal Serial Bus (USB) port.

11. The electronic device of claim 7, wherein the first collection of electronic components comprises a charging chip, and wherein the second collection of electronic components comprises a power consuming device.

12. The electronic device of claim 11, wherein one of the one or more conductive sheets forms a part of the set of electrical connection lines, and is coupled to the first collection of electronic components and the second collection of electronic components by the at least one metal wiring.

13. The electronic device of claim 1, wherein each conductive sheet comprises at least two connecting portions arranged on two opposite sides of the mounting hole along a reference direction, wherein each connecting portion of each conductive sheet is a pin structure, and wherein each pin structure is inserted into the circuit board and connected to the metal wiring inside the circuit board.

14. The electronic device of claim 1, further comprising a shielding structure arranged between the conductive sheet and the first part, wherein the shielding structure is insulated from the conductive sheet.

15. The electronic device of claim 14, wherein the circuit board comprises a first ground terminal, wherein the camera substrate assembly comprises a second ground terminal, and wherein the shielding structure is coupled to the first ground terminal.

16. The electronic device of claim 14, wherein the circuit board comprises a first ground terminal, wherein the camera substrate assembly comprises a second ground terminal, and wherein the shielding structure is coupled to the second ground terminal.

17. The electronic device of claim 14, wherein the circuit board comprises a first ground terminal, wherein the camera substrate assembly comprises a second ground terminal, and wherein the shielding structure is coupled to the first ground terminal and the second ground terminal.

18. The electronic device of claim 14, wherein the shielding structure is made of a copper foil.

19. The electronic device of claim 14, wherein the shielding structure is made of a conductive fabric.

20. The electronic device of claim 1, wherein the first part is fixed to the support member by a bonding layer.

* * * * *